(12) United States Patent
Yin

(10) Patent No.: US 11,133,836 B1
(45) Date of Patent: Sep. 28, 2021

(54) HIGH ISOLATION RADIO FREQUENCY SWITCH

(71) Applicant: NXP USA, INC., Austin, TX (US)

(72) Inventor: Yi Yin, Munich (DE)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/930,747

(22) Filed: Jul. 16, 2020

(51) Int. Cl.
*H04B 1/16* (2006.01)
*H04B 1/24* (2006.01)
*H01Q 5/371* (2015.01)
*H04B 1/10* (2006.01)
*H01Q 9/04* (2006.01)

(52) U.S. Cl.
CPC ........... *H04B 1/1638* (2013.01); *H01Q 5/371* (2015.01); *H01Q 9/0407* (2013.01); *H04B 1/1018* (2013.01); *H04B 1/1607* (2013.01); *H04B 1/24* (2013.01)

(58) Field of Classification Search
CPC .. H04B 1/1638; H04B 1/1018; H04B 1/1607; H04B 1/24; H01Q 5/371; H01Q 9/0407
See application file for complete search history.

(56) References Cited

U.S. PATENT DOCUMENTS

| | | | |
|---|---|---|---|
| 9,621,033 B2 | 4/2017 | Choy et al. | |
| 9,985,016 B2 | 5/2018 | Choy et al. | |
| 10,116,347 B1* | 10/2018 | Xu | H03F 3/72 |
| 2003/0090313 A1* | 5/2003 | Burgener | H03K 19/018521 327/408 |
| 2010/0001351 A1* | 1/2010 | Zhang | H01L 27/0207 257/392 |
| 2013/0252562 A1* | 9/2013 | Hasson | H04B 1/44 455/78 |
| 2017/0250723 A1* | 8/2017 | Srirattana | H01P 5/02 |

OTHER PUBLICATIONS

"CBTL01023; 3.3 V, one differential channel, 2 : 1 multiplexer/demultiplexer switch for PCI Express Gen3"; Product data sheet; Rev. 1—Oct. 24, 2011.
Chien, J., "A 15-Gh/s 2:1 Multiplexer in 0.18-um CMOS", IEEE Microwave and Wireless Components Letters, vol. 16, No. 10, Oct. 2006.

(Continued)

*Primary Examiner* — Nguyen T Vo

(57) ABSTRACT

A radio frequency (RF) switch circuit is provided. The switch includes a branch configured and arranged to transfer an RF signal coupled at an input node to an output node when a control signal is at a first logic value. A first transistor in the branch includes a first current electrode coupled at the input node and a second current electrode coupled to an intermediate node. The first transistor is formed in a first isolation well coupled to a bias voltage supply terminal. A second transistor in the branch includes a first current electrode coupled to the second current electrode of the first transistor at the intermediate node and a second current electrode coupled at the output node. The second transistor is formed in a second isolation well coupled to the bias voltage supply terminal. A third transistor includes a first current electrode coupled at the first intermediate node and a second current electrode coupled at a first supply terminal.

20 Claims, 3 Drawing Sheets

(56) References Cited

OTHER PUBLICATIONS

U.S. Appl. No. 16/941,670, filed Jul. 29, 2020, with a title of "High Isolation Radio Frequency Multiplexer".
Li, Q., "CMOS T/R Switch Design: Towards Ultra-Wideband and Higher Frequency", IEEE Journal of Solid-State Circuits, vol. 42, No. 3, Mar. 2007.
Talwalkar, N., "Integrated CMOS Transmit-Receive Switch Using LC-Tuned Substrate Bias for 2.4-GHz and 5.2-GHz Applications", IEEE Journal of Solid-State Circuits, vol. 39, No. 6, Jun. 2004.

\* cited by examiner

HIGH ISOLATION RADIO FREQUENCY SWITCH

BACKGROUND

Field

This disclosure relates generally to electronic circuits, and more specifically, to a high isolation radio frequency switch circuit.

Related Art

Today, many high performance RF and microwave communication devices, such as automotive radar devices for example, incorporate circuitry configured and arranged to handle and manipulate RF and microwave signals. However, such circuitry may experience signal leakage currents and excessive impedances resulting in high insertion losses and poor isolation. It is thus desirable to provide circuitry that accommodates RF and microwave signals while minimizing leakage current and impedances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a radio frequency (RF) switch circuit with high isolation and low impedance. The RF switch is characterized as closed when a control signal is at a first logic state and open when the control signal is at a second logic state. The RF switch circuit includes a first branch of series connected transistors and a second branch of series connected transistors coupled to transfer a differential RF signal received at input terminals to output terminals. A network of shunt transistors are coupled between the first and second branches to short leakage signals to ground and improve isolation.

Figure 1:
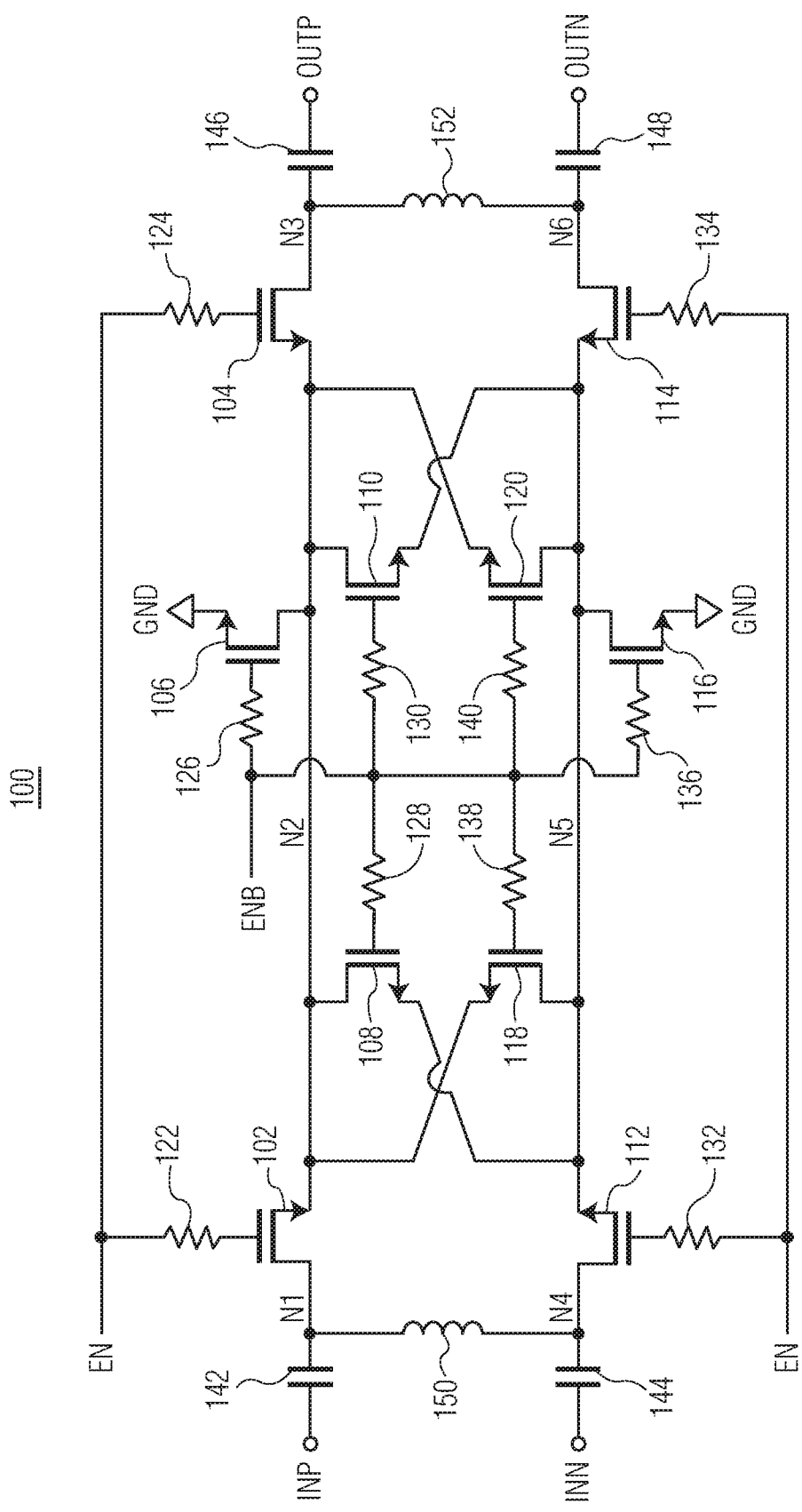
FIG. 1 illustrates, in simplified schematic diagram form, an example radio frequency switch circuit in accordance with an embodiment.

FIG. 1 illustrates, in simplified schematic diagram form, an example radio frequency (RF) switch circuit 100 in accordance with an embodiment. Switch circuit 100 is implemented as an integrated circuit and has an input terminals labeled INP and INN for receiving a differential input signal, an output terminals labeled OUTP and OUTN for providing a differential output signal, and enable input terminals labeled EN and ENB for receiving respective enable control signals EN and ENB. In this embodiment, the example implementation of switch circuit 100 includes a first switch branch, a second switch branch, shunt circuitry, and impedance match circuits. For illustration purposes, transistors depicted in FIG. 1 are shown as three-terminal devices (e.g., gate, drain, source). Corresponding bulk and body connections are shown in FIGS. 2A and 2B, 3A and 3B.

Switch circuit 100 is configured and arranged to be closed (e.g., conductive) when the control signal EN is at a first state (e.g., logic high) and open (e.g., non-conducive) when the control signal EN is at a second state (e.g., logic low). For example, switch circuit 100 is configured and arranged to transfer an RF signal coupled at the input terminals (e.g., INP and INN) to the output terminals (e.g., OUTP and OUTN) when the control signal EN is at a first logic value (e.g., logic high). In this embodiment, the RF signal may have a frequency in a range of 3 kHz to 300 GHz. For example, the RF signal may be characterized as a microwave signal (e.g., 1 GHz to 100 GHz), a radar signal (e.g., 30 MHz to 130 GHz), a mmWave signal (e.g., 30 GHz to 300 GHz), and so on. In this embodiment, the ENB control signal is a complementary signal (e.g., inverse) of the EN control signal.

The first switch branch includes N-channel MOS transistors 102-104 coupled in series between nodes labeled N1 and N3. In this embodiment, transistors 102-104 are formed in a triple well fabrication process technology and configured with a floating double well structure having a resistor connected bulk bias supply (e.g., FIG. 2A, 2B). A first current electrode of transistor 102 is coupled at node N1 and a second current electrode of transistor 102 is coupled at an intermediate node labeled N2. A first current electrode of transistor 104 is coupled to the second current electrode of transistor 102 at node N2 and a second current electrode of transistor 104 is coupled at a node N3. The EN control signal line is coupled to control electrodes of transistors 102 and 104 by way of resistors 122 and 124. A first terminal of resistor 122 is connected to the EN control signal line to receive the EN control signal and a second terminal of resistor 122 is connected to the control electrode of transistor 102. A first terminal of resistor 124 is connected to the EN control signal line to receive the EN control signal and a second terminal of resistor 124 is connected to the control electrode of transistor 104. In some embodiments, transistors 102-104 may be formed as bipolar junction transistors (BJTs).

The second switch branch includes N-channel MOS transistors 112-114 coupled in series between nodes labeled N4 and N6. In this embodiment, transistors 112-114 are formed in the triple well fabrication process technology and configured with the floating double well structure having the resistor connected bulk bias supply. A first current electrode of transistor 112 is coupled at node N4 and a second current electrode of transistor 112 is coupled at an intermediate node labeled N5. A first current electrode of transistor 114 is coupled to the second current electrode of transistor 112 at node N5 and a second current electrode of transistor 114 is coupled at a node N6. The EN control signal line is coupled to control electrodes of transistors 112 and 114 by way of resistors 132 and 134. A first terminal of resistor 132 is connected to the EN control signal line to receive the EN control signal and a second terminal of resistor 132 is connected to the control electrode of transistor 112. A first terminal of resistor 134 is connected to the EN control signal line to receive the EN control signal and a second terminal of resistor 134 is connected to the control electrode of transistor 114. In some embodiments, transistors 112-114 may be formed as BJTs.

The shunt circuitry includes N-channel MOS transistors 106-110 and 116-120 and is configured to shunt leakage signals between the first switch branch and the second switch branch when the switch circuit 100 is open. In this embodiment, transistors 106-110 and 116-120 are formed in the triple well fabrication process technology and configured with a floating single well structure (e.g., FIG. 3A, 3B).

A first current electrode of transistor 106 is coupled at node N2 and a second current electrode of transistor 106 is coupled to a voltage supply terminal labeled GND. In this embodiment, a ground voltage (e.g., 0 volts) is supplied at the GND supply terminal. A first current electrode of transistor 108 is coupled at node N2 and a second current electrode of transistor 108 is coupled at node N5. A first current electrode of transistor 110 is coupled at node N2 and a second current electrode of transistor 110 is coupled at node N5. The ENB control signal line is coupled to control electrodes of transistors 106-110 by way of resistors 126-130. A first terminal of resistor 126 is connected to the ENB control signal line to receive the ENB control signal and a second terminal of resistor 126 is connected to the control electrode of transistor 106. A first terminal of resistor 128 is connected to the ENB control signal line to receive the ENB control signal and a second terminal of resistor 128 is connected to the control electrode of transistor 108. A first terminal of resistor 130 is connected to the ENB control signal line to receive the ENB control signal and a second terminal of resistor 130 is connected to the control electrode of transistor 110.

A first current electrode of transistor 116 is coupled at node N5 and a second current electrode of transistor 116 is coupled to the GND supply terminal. A first current electrode of transistor 118 is coupled at node N2 and a second current electrode of transistor 118 is coupled at node N5. A first current electrode of transistor 120 is coupled at node N2 and a second current electrode of transistor 120 is coupled at node N5. The ENB control signal line is coupled to control electrodes of transistors 116-120 by way of resistors 136-140. A first terminal of resistor 136 is connected to the ENB control signal line to receive the ENB control signal and a second terminal of resistor 136 is connected to the control electrode of transistor 116. A first terminal of resistor 138 is connected to the ENB control signal line to receive the ENB control signal and a second terminal of resistor 138 is connected to the control electrode of transistor 118. A first terminal of resistor 140 is connected to the ENB control signal line to receive the ENB control signal and a second terminal of resistor 140 is connected to the control electrode of transistor 120. In this embodiment, resistors 122-140 are configured to have a substantially same resistance value with the resistance value in range of 1 k$\Omega$ to 10 k$\Omega$. For example, each of resistors 122-140 may be configured to have a resistance value of 5 k$\Omega$.

A first impedance match circuit is coupled at input nodes N1 and N4 and includes capacitors 142-144 and inductor 150. A first terminal of the capacitor 142 is coupled at the INP terminal and a second terminal of the capacitor 142 is coupled at the node N1. A first terminal of the capacitor 144 is coupled at the INN terminal and a second terminal of the capacitor 144 is coupled at the node N4. A first terminal of the inductor 150 is coupled at the node N1 and a second terminal of the inductor 150 is coupled at the node N5.

A second impedance match circuit is coupled at output nodes N3 and N6 and includes capacitors 146-148 and inductor 152. A first terminal of the capacitor 146 is coupled at the OUTP terminal and a second terminal of the capacitor 146 is coupled at the node N3. A first terminal of the capacitor 148 is coupled at the OUTN terminal and a second terminal of the capacitor 148 is coupled at the node N6. A first terminal of the inductor 152 is coupled at the node N3 and a second terminal of the inductor 152 is coupled at the node N6.

Figure 2A:
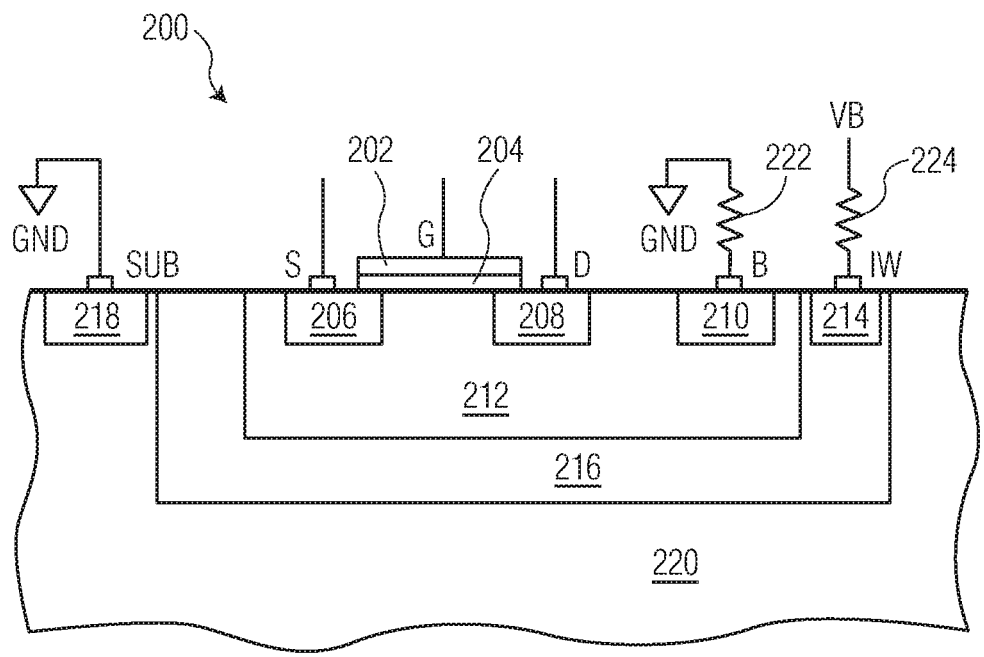
FIG. 2A illustrates, in a simplified cross-sectional view, an example N-channel transistor with a double well body formed in a triple well process technology in accordance with an embodiment.

FIG. 2A illustrates, in a simplified cross-sectional view, an example five-terminal N-channel transistor 200 with a double well body formed in a triple well process technology in accordance with an embodiment. In this embodiment, transistor 200 corresponds to transistors 102-104 and 112-114 depicted in FIG. 1. Transistor 200 is formed in an isolated P-well 212 and includes a gate electrode 202 labeled G formed on a gate dielectric 204. Gate electrode 202 typically includes a polysilicon material but may include any suitable conductive material. Gate dielectric 204 may be formed from any suitable dielectric material such as a grown or deposited oxide material. Transistor 200 includes an N+ region 206 formed as a first current electrode 206 labeled S and an N+ region 208 formed as a second current electrode 208 labeled D on opposing sides of gate electrode 202, forming a channel below the gate dielectric 204. Transistor 200 may include other aspects not shown in FIG. 2A such as a gate electrode contact, source/drain extension implants and/or sidewall spacers, and the like.

P+ well tie 210 provides connectivity between P-well body electrode contact labeled B and P-well body 212. A first body connection resistor 222 is configured to couple the body electrode B of transistor 200 to the GND supply terminal. P-well 212 of transistor 200 is formed within a surrounding body isolation N-well 216. The surrounding isolation N-well 216 is formed as a deep N-well or buried N-well implant with formed N-type doped or implanted wall portions surrounding the P-well 212. N+ well tie 214 provides connectivity between isolation N-well electrode contact labeled IW and isolation N-well 216. A second body connection resistor 224 is configured to couple the body isolation electrode IW of transistor 200 to a bias voltage supply terminal labeled VB. In this embodiment, a positive voltage such as an operating voltage of circuitry (e.g., VDD) may be provided at the VB supply terminal, for example. Isolation N-well 216 isolates body P-well 212 from the P-type substrate 220. P+ substrate tie 218 provides connectivity between substrate electrode contact labeled SUB and P− substrate 220. The gate electrode G, first and second current electrodes S and D (e.g., source and drain), isolated P-well body electrode B, and body isolation N-well electrode IW can be characterized as five terminals of transistor 200. In this embodiment, the term "electrode" may be used interchangeably with the term "terminal" when referring to transistor 200.

Figure 2B:
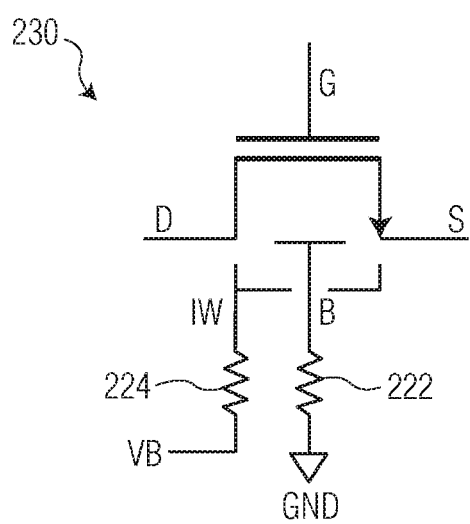
FIG. 2B illustrates, in simplified schematic diagram form, the example N-channel transistor of FIG. 2A with body connection circuit in accordance with an embodiment.

FIG. 2B illustrates, in simplified schematic diagram form, an example five-terminal N-channel transistor 230 with body connection circuit in accordance with an embodiment. In this embodiment, transistor 230 corresponds to the cross-sectional example five-terminal transistor 200 of FIG. 2A. The transistor 230 includes a first current electrode labeled S (e.g., source), a second current electrode labeled D (e.g., drain), and a control electrode labeled G (e.g., gate). The transistor 230 further includes a body electrode labeled B and a body isolation electrode labeled IW (e.g., isolation well). Each of electrodes S, D, G, B, and IW of transistor 230 correspond to respective electrodes S, D, G, B, and IW of the cross-sectional view of transistor 200. In this embodiment, the term "electrode" may be used interchangeably with the term "terminal" when referring to transistor 230.

The body connection circuit of the transistor 230 includes resistors 222 and 224 coupled to provide respective voltages to the body well 212 and the isolation well 216. A first terminal of resistor 222 is connected to the body electrode B and a second terminal of resistor 222 is connected to the GND supply terminal. A first terminal of resistor 224 is connected to the body isolation electrode IW and a second terminal of resistor 222 is connected to the VB supply terminal. For depiction of detailed body connections, the transistor 230 with the body connection circuit may be substituted for each of transistors 102-104 and 112-114 shown in FIG. 1.

In this embodiment, the transistor 230 may be characterized as a double-well (e.g., P-well 212 and isolation N-well 216) body floating transistor. For example, in operation (e.g., switch circuit 100 closed), the resistors 222 and 224 provide an open circuit during transfer of an RF signal through switch 100 thus reducing insertion loss without affecting the impedance of the switch 100 while closed. In this manner, the intrinsic diodes formed between source region 206 and body region 212, drain region 208 and body region 212, body region 212 and body isolation region 216, and body isolation region and substrate 220 are prevented from being turned on by large signals thus improving linearity.

Figure 3A:
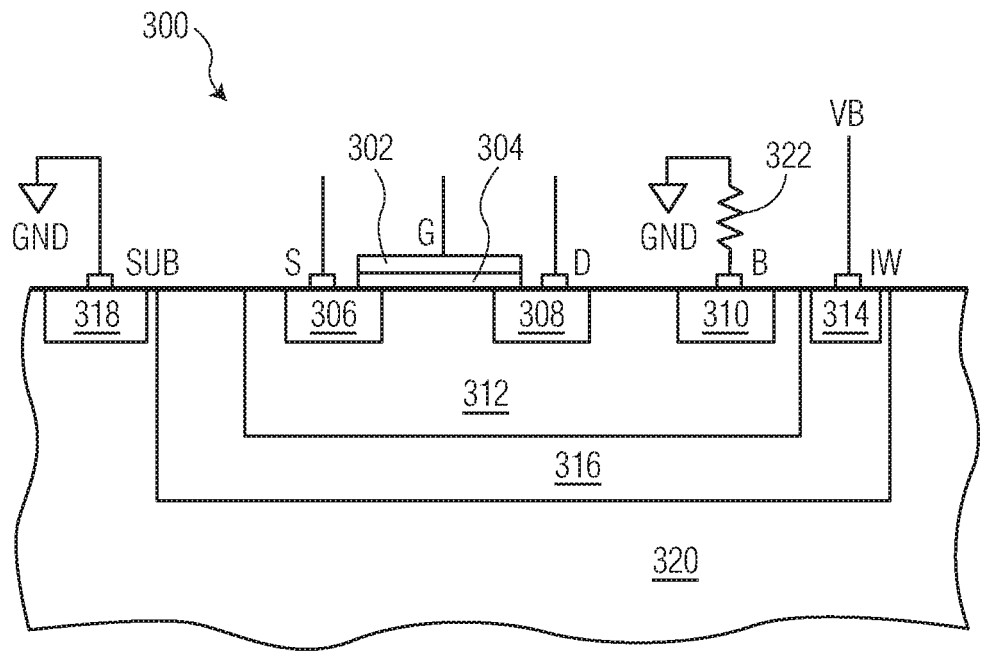
FIG. 3A illustrates, in a simplified cross-sectional view, an example N-channel transistor with a P-well body formed in a triple well process technology in accordance with an embodiment.

FIG. 3A illustrates, in a simplified cross-sectional view, an example five-terminal N-channel transistor 300 with a double well body formed in a triple well process technology in accordance with an embodiment. In this embodiment, transistor 300 corresponds to transistors 106-110 and 116-120 depicted in FIG. 1. Transistor 300 is formed in an isolated P-well 312 and includes a gate electrode 302 labeled G formed on a gate dielectric 304. Gate electrode 302 typically includes a polysilicon material but may include any suitable conductive material. Gate dielectric 304 may be formed from any suitable dielectric material such as a grown or deposited oxide material. Transistor 300 includes an N+ region 306 formed as a first current electrode 306 labeled S and an N+ region 308 formed as a second current electrode 308 labeled D on opposing sides of gate electrode 302, forming a channel below the gate dielectric 304. Transistor 300 may include other aspects not shown in FIG. 3A such as a gate electrode contact, source/drain extension implants and/or sidewall spacers, and the like.

P+ well tie 310 provides connectivity between P-well body electrode contact labeled B and P-well body 312. A body connection resistor 322 is configured to couple the body electrode B of transistor 300 to the GND supply terminal. P-well 312 of transistor 300 is formed within a surrounding body isolation N-well 316. The surrounding isolation N-well 316 is formed as a deep N-well or buried N-well implant with formed N-type doped or implanted wall portions surrounding the P-well 312. N+ well tie 314 provides connectivity between isolation N-well electrode contact labeled IW and isolation N-well 316. In this embodiment, the body isolation electrode IW of transistor 300 is directly connected to a bias voltage supply terminal labeled VB. Isolation N-well 316 isolates body P-well 312 from the P-type substrate 320. P+ substrate tie 318 provides connectivity between substrate electrode contact labeled SUB and P− substrate 320. The gate electrode G, first and second current electrodes S and D (e.g., source and drain), isolated P-well body electrode B, and body isolation N-well electrode IW can be characterized as five terminals of transistor 300. In this embodiment, the term "electrode" may be used interchangeably with the term "terminal" when referring to transistor 300.

Figure 3B:
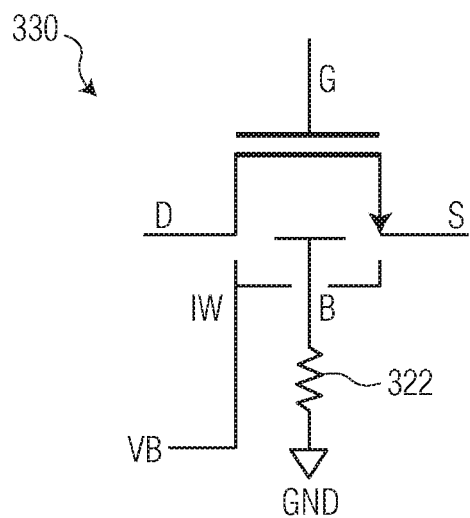
FIG. 3B illustrates, in simplified schematic diagram form, the example N-channel transistor of FIG. 3A with body connection circuit in accordance with an embodiment.

FIG. 3B illustrates, in simplified schematic diagram form, an example five-terminal N-channel transistor 330 with body connection circuit in accordance with an embodiment. In this embodiment, transistor 330 corresponds to the cross-sectional example five-terminal transistor 300 of FIG. 3A. The transistor 330 includes a first current electrode labeled S (e.g., source), a second current electrode labeled D (e.g., drain), and a control electrode labeled G (e.g., gate). The transistor 330 further includes a body electrode labeled B and a body isolation electrode labeled IW (e.g., isolation well). Each of electrodes S, D, G, B, and IW of transistor 330 correspond to respective electrodes S, D, G, B, and IW of the cross-sectional view of transistor 300. In this embodiment, the term "electrode" may be used interchangeably with the term "terminal" when referring to transistor 330.

The body connection circuit of the transistor 330 includes resistor 322 coupled to provide the ground voltage to the body well 312 and a direct connection to provide the VB voltage to the isolation well 316. A first terminal of resistor 322 is connected to the body electrode B and a second terminal of resistor 322 is connected to the GND supply terminal. In this embodiment, the body isolation electrode IW is connected to the VB supply terminal. For depiction of detailed body connections, the transistor 330 with the body connection circuit may be substituted for each of transistors 106-110 and 116-120 shown in FIG. 1.

In this embodiment, the transistor 330 may be characterized as a single-well (e.g., P-well 312) body floating transistor. For example, when switch circuit 100 is open, shunt transistor are 106-110 and 116-120 are enabled allowing the resistor 322 to provide an open circuit for an RF leakage signal thus minimizing the Coff impedance of the switch 100. In this manner, insertion loss and linearity are improved.

Generally, there is provided, a circuit including a first branch coupled between a first input node and a first output node, the first branch configured and arranged to transfer a radio frequency (RF) signal coupled at the first input node to the first output node when a first control signal is at a first logic value; a first transistor in the first branch having a first current electrode coupled at the first input node and a second current electrode coupled to a first intermediate node, the first transistor formed in a first isolation well coupled to a bias voltage supply terminal; a second transistor in the first branch having a first current electrode coupled to the second current electrode of the first transistor at the first intermediate node and a second current electrode coupled at the first output node, the second transistor formed in a second isolation well coupled to the bias voltage supply terminal; and a third transistor having a first current electrode coupled at the first intermediate node and a second current electrode coupled at a first supply terminal. The circuit may further include a first resistor having a first terminal coupled to receive the first control signal and a second terminal coupled to a control electrode of the first transistor; and a second resistor having a first terminal coupled to receive the first control signal and a second terminal coupled to a control electrode of the second transistor. The circuit may further include a first resistor having a first terminal coupled to the bias voltage supply terminal and a second terminal coupled to the first isolation well of the first transistor; and a second resistor having a first terminal coupled to the bias voltage supply terminal and a second terminal coupled to the second isolation well of the second transistor. The third transistor may further include a control electrode coupled to receive a second control signal, the second control signal a complementary signal of the first control signal. The third transistor may be formed in a third isolation well connected directly to the bias voltage supply terminal. The RF signal may be coupled at the first input node by way of a capacitor. The circuit may further include a second branch coupled between a second input node and a second output node, the second branch configured and arranged to transfer a second RF signal coupled at the second input node to the second output node when the first control signal is at the first logic value; a fourth transistor in the second branch having a first current electrode coupled at the second input node and a second current electrode coupled to a second intermediate node; a fifth transistor in the second branch having a first current electrode coupled to the second current electrode of the fourth transistor at the second intermediate node and a second current electrode coupled at the second output node; and a sixth transistor having a first current electrode coupled at the first intermediate node and a second current electrode coupled at the second intermediate node, the sixth transistor configured to be in a non-conducting state when the first control signal is at the first logic value. The first RF signal and the second RF signal together may be characterized as a differential signal. The circuit may further include an impedance matching circuit connected at the first input node and the second input node.

In another embodiment, there is provided, a circuit including a first branch coupled between a first input node and a first output node, the first branch configured and arranged to transfer an input signal coupled at the first input node to the first output node when a first control signal is at a first logic value; a first transistor in the first branch having a first current electrode coupled at the first input node and a second current electrode coupled to a first intermediate node, the first transistor formed in a first isolation well coupled to a bias voltage supply terminal; a second transistor in the first branch having a first current electrode coupled to the second current electrode of the first transistor at the first intermediate node and a second current electrode coupled at the first output node, the second transistor formed in a second isolation well coupled to the bias voltage supply terminal; and a third transistor having a first current electrode coupled at the first intermediate node and a second current electrode coupled at a first supply terminal, the third transistor formed in a third isolation well connected directly to the bias voltage supply terminal. The circuit may further include a first resistor having a first terminal coupled to receive the first control signal and a second terminal coupled to a control electrode of the first transistor; and a second resistor having a first terminal coupled to receive the first control signal and a second terminal coupled to a control electrode of the second transistor. The third transistor may further include a control electrode coupled to receive a second control signal, the second control signal a complementary signal of the first control signal. The circuit may further include a first resistor having a first terminal coupled to the bias voltage supply terminal and a second terminal coupled to the first isolation well of the first transistor; and a second resistor having a first terminal coupled to the bias voltage supply terminal and a second terminal coupled to the second isolation well of the second transistor. The circuit may further include a second branch coupled between a second input node and a second output node, the second branch configured and arranged to transfer a second input signal coupled at the second input node to the second output node when the first control signal is at the first logic value; a fourth transistor in the second branch having a first current electrode coupled at the second input node and a second current electrode coupled to a second intermediate node; and a fifth transistor in the second branch having a first current electrode coupled to the second current electrode of the fourth transistor at the second intermediate node and a second current electrode coupled at the second output node. The first input signal and the second input signal together may be characterized as a differential signal. The circuit may further include a sixth transistor having a first current electrode coupled at the first intermediate node and a second current electrode coupled at the second intermediate node, the sixth transistor configured to be in a conducting state when the first control signal is at a second logic value.

In yet another embodiment, there is provided, a circuit including a first branch coupled between a first input node and a first output node, the first branch configured and arranged to transfer an input signal coupled at the first input node to the first output node when a first control signal is at a first logic value, the first branch including a first transistor having a first current electrode coupled at the first input node, a second current electrode coupled to a first intermediate node, and a control electrode coupled to receive the first control signal; a second transistor having a first current electrode coupled to the second current electrode of the first transistor at the first intermediate node, a second current electrode coupled at the first output node, and a control electrode coupled to receive the first control signal; and a third transistor having a first current electrode coupled at the first intermediate node, a second current electrode coupled at a first supply terminal, and a control electrode coupled to receive a second control signal, the second control signal a complementary signal of the first control signal; a second branch coupled between a second input node and a second output node, the second branch configured and arranged to transfer a second input signal coupled at the second input node to the second output node when the first control signal is at the first logic value, the second branch including a fourth transistor having a first current electrode coupled at the second input node, a second current electrode coupled to a second intermediate node, and a control electrode coupled to receive the first control signal; a fifth transistor having a first current electrode coupled to the second current electrode of the fourth transistor at the second intermediate node, a second current electrode coupled at the second output node, and a control electrode coupled to receive the first control signal; and a sixth transistor having a first current electrode coupled at the first intermediate node, a second current electrode coupled at the second intermediate node, and a control electrode coupled to receive the second control signal. The circuit may further include a first resistor having a first terminal coupled to receive the first control signal and a second terminal connected to the control electrode of the first transistor; a second resistor having a first terminal coupled to receive the first control signal and a second terminal connected to the control electrode of the second transistor; and a third resistor having a first terminal coupled to receive the second control signal and a second terminal connected to the control electrode of the third transistor. Each of the first, second, third, fourth, fifth, and sixth transistors may be formed in a respective isolation well. Each isolation well of the first, second, fourth, and fifth transistors may be coupled to a bias voltage supply terminal by way of a resistor, and each isolation well of the third and sixth transistors may be connected directly to the bias voltage supply terminal.

By now it should be appreciated that there has been provided, a radio frequency (RF) switch circuit with high isolation and low impedance. The RF switch is characterized as closed when a control signal is at a first logic state and open when the control signal is at a second logic state. The RF switch circuit includes a first branch of series connected transistors and a second branch of series connected transistors coupled to transfer a differential RF signal received at input terminals to output terminals. A network of shunt transistors are coupled between the first and second branches to short leakage signals to ground and improve isolation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first branch coupled between a first input node and a first output node, the first branch configured and arranged to transfer a radio frequency (RF) signal coupled at the first input node to the first output node when a first control signal is at a first logic value;
   a first transistor in the first branch having a first current electrode coupled at the first input node and a second current electrode coupled to a first intermediate node, the first transistor formed in a first isolation well coupled to a bias voltage supply terminal;
   a second transistor in the first branch having a first current electrode coupled to the second current electrode of the first transistor at the first intermediate node and a second current electrode coupled at the first output node, the second transistor formed in a second isolation well coupled to the bias voltage supply terminal; and
   a third transistor having a first current electrode coupled at the first intermediate node and a second current electrode coupled at a first supply terminal.

2. The circuit of claim 1, further comprising:
   a first resistor having a first terminal coupled to receive the first control signal and a second terminal coupled to a control electrode of the first transistor; and
   a second resistor having a first terminal coupled to receive the first control signal and a second terminal coupled to a control electrode of the second transistor.

3. The circuit of claim 1, further comprising:
   a first resistor having a first terminal coupled to the bias voltage supply terminal and a second terminal coupled to the first isolation well of the first transistor; and
   a second resistor having a first terminal coupled to the bias voltage supply terminal and a second terminal coupled to the second isolation well of the second transistor.

4. The circuit of claim 1, wherein the third transistor further includes a control electrode coupled to receive a second control signal, the second control signal a complementary signal of the first control signal.

5. The circuit of claim 1, wherein the third transistor is formed in a third isolation well connected directly to the bias voltage supply terminal.

6. The circuit of claim 1, wherein the RF signal is coupled at the first input node by way of a capacitor.

7. The circuit of claim 1, further comprising:
   a second branch coupled between a second input node and a second output node, the second branch configured and arranged to transfer a second RF signal coupled at the second input node to the second output node when the first control signal is at the first logic value;
   a fourth transistor in the second branch having a first current electrode coupled at the second input node and a second current electrode coupled to a second intermediate node;
   a fifth transistor in the second branch having a first current electrode coupled to the second current electrode of the fourth transistor at the second intermediate node and a second current electrode coupled at the second output node; and
   a sixth transistor having a first current electrode coupled at the first intermediate node and a second current electrode coupled at the second intermediate node, the sixth transistor configured to be in a non-conducting state when the first control signal is at the first logic value.

8. The circuit of claim 7, wherein the first RF signal and the second RF signal together are characterized as a differential signal.

9. The circuit of claim 7, further comprising an impedance matching circuit connected at the first input node and the second input node.

10. A circuit comprising:
    a first branch coupled between a first input node and a first output node, the first branch configured and arranged to transfer an input signal coupled at the first input node to the first output node when a first control signal is at a first logic value;
    a first transistor in the first branch having a first current electrode coupled at the first input node and a second current electrode coupled to a first intermediate node, the first transistor formed in a first isolation well coupled to a bias voltage supply terminal;
    a second transistor in the first branch having a first current electrode coupled to the second current electrode of the first transistor at the first intermediate node and a second current electrode coupled at the first output node, the second transistor formed in a second isolation well coupled to the bias voltage supply terminal; and
a third transistor having a first current electrode coupled at the first intermediate node and a second current electrode coupled at a first supply terminal, the third transistor formed in a third isolation well connected directly to the bias voltage supply terminal.

11. The circuit of claim 10, further comprising:
a first resistor having a first terminal coupled to receive the first control signal and a second terminal coupled to a control electrode of the first transistor; and
a second resistor having a first terminal coupled to receive the first control signal and a second terminal coupled to a control electrode of the second transistor.

12. The circuit of claim 10, wherein the third transistor further includes a control electrode coupled to receive a second control signal, the second control signal a complementary signal of the first control signal.

13. The circuit of claim 10, further comprising:
a first resistor having a first terminal coupled to the bias voltage supply terminal and a second terminal coupled to the first isolation well of the first transistor; and
a second resistor having a first terminal coupled to the bias voltage supply terminal and a second terminal coupled to the second isolation well of the second transistor.

14. The circuit of claim 10, further comprising:
a second branch coupled between a second input node and a second output node, the second branch configured and arranged to transfer a second input signal coupled at the second input node to the second output node when the first control signal is at the first logic value;
a fourth transistor in the second branch having a first current electrode coupled at the second input node and a second current electrode coupled to a second intermediate node; and
a fifth transistor in the second branch having a first current electrode coupled to the second current electrode of the fourth transistor at the second intermediate node and a second current electrode coupled at the second output node.

15. The circuit of claim 14, wherein the first input signal and the second input signal together are characterized as a differential signal.

16. The circuit of claim 14, further comprising a sixth transistor having a first current electrode coupled at the first intermediate node and a second current electrode coupled at the second intermediate node, the sixth transistor configured to be in a conducting state when the first control signal is at a second logic value.

17. A circuit comprising:
a first branch coupled between a first input node and a first output node, the first branch configured and arranged to transfer an input signal coupled at the first input node to the first output node when a first control signal is at a first logic value, the first branch comprising:
a first transistor having a first current electrode coupled at the first input node, a second current electrode coupled to a first intermediate node, and a control electrode coupled to receive the first control signal;
a second transistor having a first current electrode coupled to the second current electrode of the first transistor at the first intermediate node, a second current electrode coupled at the first output node, and a control electrode coupled to receive the first control signal; and
a third transistor having a first current electrode coupled at the first intermediate node, a second current electrode coupled at a first supply terminal, and a control electrode coupled to receive a second control signal, the second control signal a complementary signal of the first control signal;
a second branch coupled between a second input node and a second output node, the second branch configured and arranged to transfer a second input signal coupled at the second input node to the second output node when the first control signal is at the first logic value, the second branch comprising:
a fourth transistor having a first current electrode coupled at the second input node, a second current electrode coupled to a second intermediate node, and a control electrode coupled to receive the first control signal;
a fifth transistor having a first current electrode coupled to the second current electrode of the fourth transistor at the second intermediate node, a second current electrode coupled at the second output node, and a control electrode coupled to receive the first control signal; and
a sixth transistor having a first current electrode coupled at the first intermediate node, a second current electrode coupled at the second intermediate node, and a control electrode coupled to receive the second control signal.

18. The circuit of claim 17, further comprising:
a first resistor having a first terminal coupled to receive the first control signal and a second terminal connected to the control electrode of the first transistor;
a second resistor having a first terminal coupled to receive the first control signal and a second terminal connected to the control electrode of the second transistor; and
a third resistor having a first terminal coupled to receive the second control signal and a second terminal connected to the control electrode of the third transistor.

19. The circuit of claim 17, wherein each of the first, second, third, fourth, fifth, and sixth transistors is formed in a respective isolation well.

20. The circuit of claim 19, wherein each isolation well of the first, second, fourth, and fifth transistors is coupled to a bias voltage supply terminal by way of a resistor, and wherein each isolation well of the third and sixth transistors is connected directly to the bias voltage supply terminal.

* * * * *